United States Patent
Kamiyama

(10) Patent No.: US 11,231,743 B2
(45) Date of Patent: Jan. 25, 2022

(54) TIMER, ELECTRONIC APPARATUS, AND VEHICLE

(71) Applicant: Seiko Epson Corporation, Tokyo (JP)

(72) Inventor: Masayuki Kamiyama, Chino (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/937,757

(22) Filed: Jul. 24, 2020

(65) Prior Publication Data

US 2021/0026400 A1     Jan. 28, 2021

(30) Foreign Application Priority Data

Jul. 25, 2019    (JP) .............................. JP2019-136835

(51) Int. Cl.
| | |
|---|---|
| G06F 1/14 | (2006.01) |
| H03K 5/05 | (2006.01) |
| H03K 5/06 | (2006.01) |
| G01R 19/165 | (2006.01) |
| G04F 1/00 | (2006.01) |
| H03K 5/00 | (2006.01) |
| B60L 58/00 | (2019.01) |

(52) U.S. Cl.
CPC .............. *G06F 1/14* (2013.01); *B60L 58/00* (2019.02); *G01R 19/16585* (2013.01); *G04F 1/005* (2013.01); *H03K 5/05* (2013.01); *H03K 5/065* (2013.01); *H03K 2005/00078* (2013.01)

(58) Field of Classification Search
CPC ... G06F 1/04; G06F 1/14; B60L 58/00; G01R 19/165; G01R 19/16557; G01R 19/16585; G04F 1/005; H03K 5/01; H03K 5/04; H03K 5/05; H03K 5/06; H03K 5/065; H03K 2005/00013; H03K 2005/00078; H03K 2005/00084

See application file for complete search history.

(56) References Cited

U.S. PATENT DOCUMENTS

| | | | | |
|---|---|---|---|---|
| 5,883,501 | A | * 3/1999 | Arakawa | .................. G05F 3/247 |
| | | | | 323/222 |
| 2006/0047991 | A1 | * 3/2006 | Leung | ....................... G06F 1/04 |
| | | | | 713/500 |
| 2017/0153661 | A1 | 6/2017 | Kamiyama et al. | |

FOREIGN PATENT DOCUMENTS

JP             2017-101932 A     6/2017

* cited by examiner

*Primary Examiner* — Diana J. Cheng
(74) *Attorney, Agent, or Firm* — Harness, Dickey & Pierce, P.L.C.

(57) ABSTRACT

A timer includes a timing counter configured to generate a timing datum, a clock pulse signal generation circuit configured to generate a clock pulse signal used to operate the timing counter, and an interface circuit configured to receive an access signal, wherein the timing counter is an asynchronous counter, and the clock pulse signal generation circuit generates the clock pulse signal having a first pulse width when there is a possibility that the interface circuit receives the access signal, and generates the clock pulse signal having a second pulse width longer than the first pulse width when there is no possibility that the interface circuit receives the access signal.

10 Claims, 10 Drawing Sheets

TIMER, ELECTRONIC APPARATUS, AND VEHICLE

The present application is based on, and claims priority from JP Application Serial Number 2019-136835, filed Jul. 25, 2019, the disclosure of which is hereby incorporated by reference herein in its entirety.

BACKGROUND

1. Technical Field

The present disclosure relates to a timer, an electronic apparatus, and a vehicle.

2. Related Art

In JP-A-2017-101932 (Document 1), there is described a timer using asynchronous counter as a timing counter for timing seconds, minutes, hours, days, months, and years for reduction in power consumption. In the timer described in Document 1, the timing counter has counters for respectively counting seconds, minutes, hours, days, months, and years, and in the counter for counting seconds, a clock pulse signal is input every second, and the counter for counting seconds performs the timing operation in the period during which the clock pulse signal is input to update a timing datum of the second, and generates a carry signal for the next stage every minute. In the counter for counting minutes, the carry signal from the counter for counting seconds is input every minute, and the counter for counting minutes performs the timing operation in the period during which the carry signal is input to update a timing datum of the minute, and generates a carry signal to the next stage every hour. The other counters also perform the timing operation in a similar manner.

When the timing of the carry of the timing counter and the timing of receiving an access signal requesting retrieval or rewriting of the timing datum from an external device overlap each other, it is necessary to give priority to either one of a process on the timing operation of the timing counter and a process on the access signal, and delay the other thereof. In either case, in order to make fast access from the external device possible, it is necessary to complete the timing operation of the timing counter in a short time. Therefore, in a related-art timer having the timing counter formed of the asynchronous counter such as the timer described in Document 1, there is necessity of shortening the pulse width of the clock pulse signal input to the timing counter, but when the pulse width of the clock pulse signal is too short, there is a possibility that the timing counter fails to complete the timing operation, and a wrong timing datum is generated depending on the state of the timer.

SUMMARY

A timer according to an aspect of the present disclosure includes a timing counter configured to generate a timing datum, a clock pulse signal generation circuit configured to generate a clock pulse signal used to operate the timing counter, and an interface circuit configured to receive an access signal, wherein the timing counter is an asynchronous counter, and the clock pulse signal generation circuit generates the clock pulse signal having a first pulse width when there is a possibility that the interface circuit receives the access signal, and generates the clock pulse signal having a second pulse width longer than the first pulse width when there is no possibility that the interface circuit receives the access signal.

In the timer according to the aspect described above, the first pulse width may be shorter than a cycle time of the access signal.

In the timer according to the aspect described above, the second pulse width may be a length obtained by multiplying a period of a source clock signal by 2 to N-th power, N representing a natural number.

In the timer according to the aspect described above, the clock pulse signal generation circuit may determine whether or not there is a possibility that the interface circuit receives the access signal based on a first power supply voltage supplied to the timer.

The timer according to the aspect described above may further include a power supply voltage determination circuit configured to determine whether or not the first power supply voltage is no lower than a predetermined voltage value, wherein the clock pulse signal generation circuit may determine that there is a possibility that the interface circuit receives the access signal when the power supply voltage determination circuit determines that the first power supply voltage is no lower than the predetermined voltage value, and may determine that there is no possibility that the interface circuit receives the access signal when the power supply voltage determination circuit determines that the first power supply voltage is lower than the predetermined voltage value.

The timer according to the aspect described above may further include a power supply voltage selection circuit configured to select the first power supply voltage when the power supply voltage determination circuit determines that the first power supply voltage is no lower than the predetermined voltage value, and select a second power supply voltage supplied to the timer when the power supply voltage determination circuit determines that the first power supply voltage is lower than the predetermined voltage value.

In the timer according to the aspect described above, the clock pulse signal generation circuit may include a pulse signal generation circuit configured to generate a pulse signal based on a signal obtained by dividing a frequency of a source clock signal, a delay circuit configured to output a signal obtained by delaying the pulse signal, a selector configured to select and output one of an output signal of the delay circuit and a signal having a constant voltage, and a logic circuit to which an output signal of the selector and the pulse signal are input, the clock pulse signal having the first pulse width may be a signal output from the logic circuit when the selector selects and outputs the output signal of the delay circuit, and the clock pulse signal having the second pulse width may be a signal output from the logic circuit when the selector selects and outputs the signal having the constant voltage.

The timer according to the aspect described above may further include a read buffer configured to obtain and hold, at predetermined timing, the timing datum generated by the timing counter, wherein the interface circuit may output the timing datum held by the read buffer when receiving the access signal requesting reading of the timing datum, and the timing counter may generate the timing datum with a predetermined period irrespective of whether or not the interface circuit received the access signal.

In the timer according to the aspect described above, the timing datum may include time information of a year, a month, a day, an hour, a minute, and a second.

An electronic apparatus according to another aspect of the present disclosure includes the timer according to any one of the above aspects, and a processing circuit which operates based on an output signal from the timer.

A vehicle according to another aspect of the present disclosure includes the timer according to any one of the above aspects, and a processing circuit which operates based on an output signal from the timer.

DESCRIPTION OF EXEMPLARY EMBODIMENTS

Some preferred embodiments of the present disclosure will hereinafter be described in detail using the drawings. It should be noted that the embodiments described below do not unreasonably limit the content of the present disclosure as set forth in the appended claims. Further, all of the constituents described below are not necessarily essential elements of the present disclosure.

1. Timer 1-1. Configuration of Timer

Figure 1:
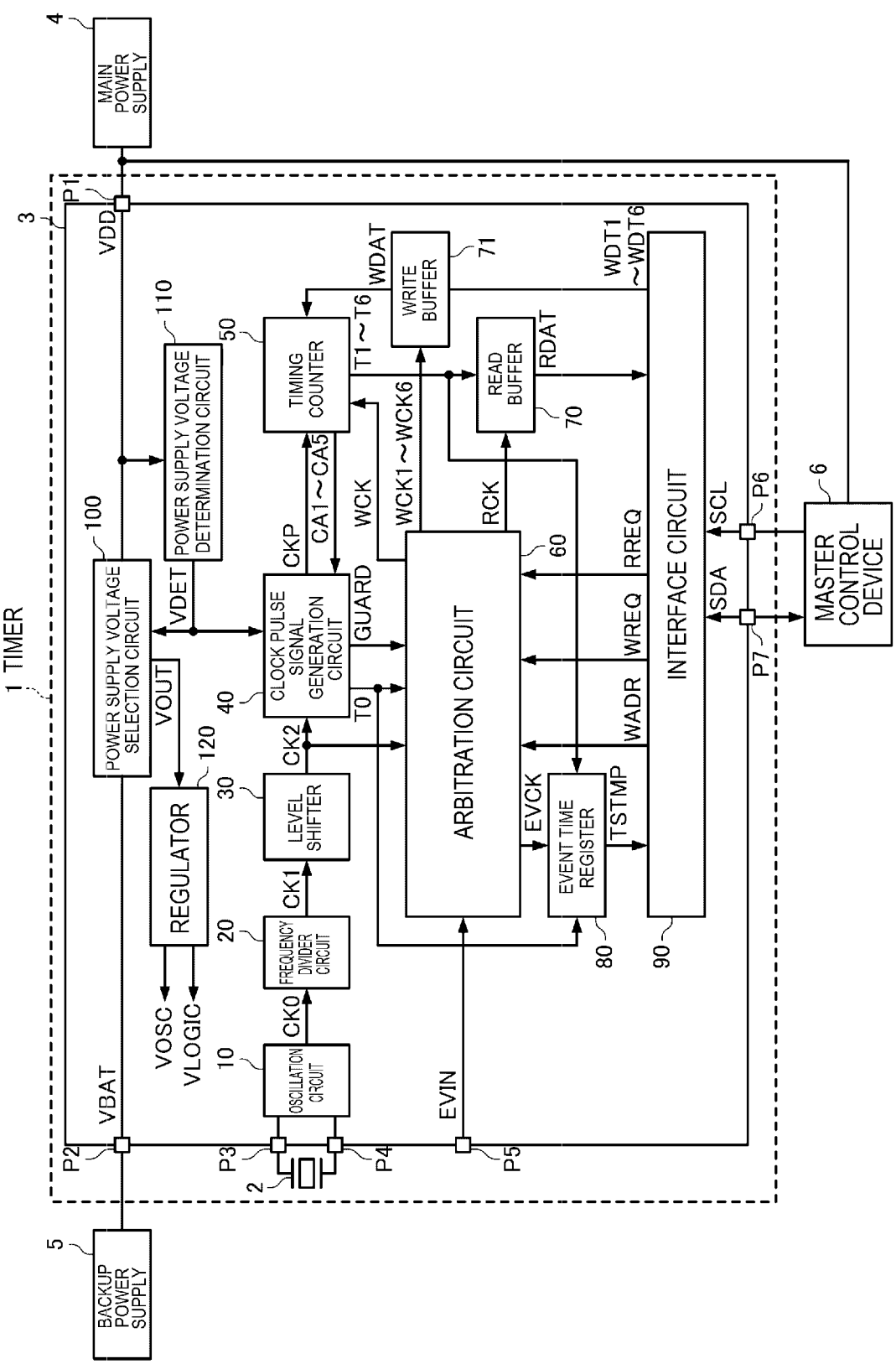
FIG. 1 is a functional block diagram of a timer according to the embodiment.

FIG. 1 is a functional block diagram of a timer 1 according to the present embodiment. As shown in FIG. 1, the timer 1 is provided with a resonator 2 and an integrated circuit 3.

The timer 1 is supplied with a power supply voltage VDD as a first power supply voltage via a terminal P1 of the integrated circuit 3 from a main power supply 4, and is supplied with a power supply voltage VBAT as a second power supply voltage via a terminal P2 of the integrated circuit 3 from a backup power supply 5.

The resonator 2 can be a tuning-fork crystal resonator, an AT-cut crystal resonator, an SC-cut crystal resonator, or the like, or can also be an SAW (Surface Acoustic Wave) resonator, or a piezoelectric resonator other than the quartz crystal resonators. Further, the resonator 2 can be an MEMS (Micro Electro Mechanical Systems) resonator formed of a material such as a silicon semiconductor. The resonator 2 can be excited due to a piezoelectric effect, or can also be driven by a coulomb force (electrostatic force).

The integrated circuit 3 is provided with an oscillation circuit 10, a frequency divider circuit 20, a level shifter 30, a clock pulse signal generation circuit 40, a timing counter 50, an arbitration circuit 60, a read buffer 70, a write buffer 71, an event time register 80, an interface circuit 90, a power supply voltage selection circuit 100, a power supply voltage determination circuit 110, and a regulator 120. It should be noted that the integrated circuit 3 can be provided with a configuration obtained by omitting or modifying some of these constituents, or adding other constituents.

The power supply voltage determination circuit 110 monitors the power supply voltage VDD to determine whether or not the power supply voltage VDD is equal to or higher than a predetermined voltage value VT to output a determination signal VDET. In the present embodiment, the power supply voltage determination circuit 110 outputs the determination signal VDET in a high level when it has been determined that the power supply voltage VDD has been no lower than the voltage value VT, and outputs the determination signal VDET in a low level when it has been determined that the power supply voltage VDD has been lower than the voltage value VT.

The power supply voltage selection circuit 100 selects the power supply voltage VDD or the power supply voltage VBAT based on the determination signal VDET to output the result as a power supply voltage VOUT. Specifically, the power supply voltage selection circuit 100 selects the power supply voltage VDD when the determination signal VDET is in the high level, namely when it has been determined by the power supply voltage determination circuit 110 that the power supply voltage VDD has been no lower than the voltage value VT. Further, the power supply voltage selection circuit 100 selects the power supply voltage VBAT when the determination signal VDET is in the low level, namely when it has been determined by the power supply voltage determination circuit 110 that the power supply voltage VDD has been lower than the voltage value VT.

Figure 2:
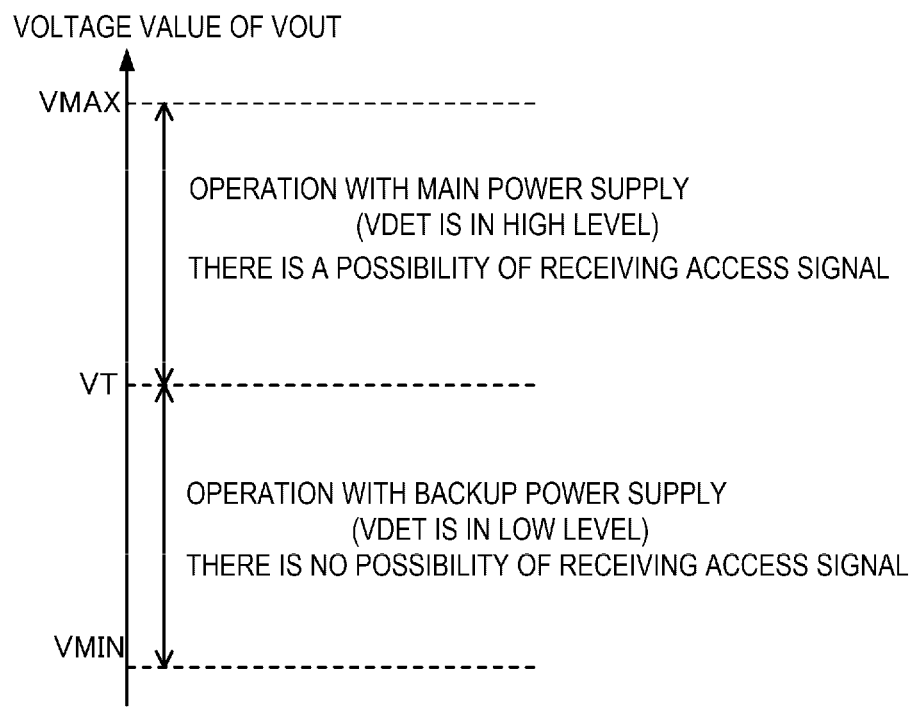
FIG. 2 is an explanatory diagram regarding a power supply voltage to be supplied to the timer.

Therefore, as shown in FIG. 2, when the power supply voltage VDD is supplied to the timer 1 from the main power supply 4, the power supply voltage VOUT is the power supply voltage VDD, and has a predetermined voltage value no lower than VT and no higher than VMAX. When the supply of the power supply voltage VDD from the main power supply 4 to the timer 1 is stopped, the power supply voltage VOUT is immediately switched to the power supply voltage VBAT, and has a predetermined voltage value no lower than VMIN and no higher than VT. Therefore, it is possible for the timer 1 to continue the timing operation during the period in which the supply of the power supply voltage VDD from the main power supply 4 is stopped. In contrast, a master control device 6 for controlling the operation of the timer 1 operates while being supplied with the power supply voltage VDD from the main power supply 4, and stops the operation when the supply of the power supply voltage VDD from the main power supply 4 is stopped.

The regulator 120 generates a power supply voltage VOSC and a power supply voltage VLOGIC each stabilized and having a constant voltage value based on the power supply voltage VOUT. In the present embodiment, the power supply voltage VOSC is lower than the power supply voltage VLOGIC. It should be noted that when the power supply voltage VOUT is lower than a predetermined voltage value, the regulator 120 cannot generate the power supply voltage VLOGIC having the desired voltage value, and therefore, the power supply voltage VLOGIC follows the power supply VOUT.

The power supply voltage VOSC is supplied to the oscillation circuit 10, the frequency divider circuit 20, and the level shifter 30. Further, the power supply voltage VLOGIC is supplied to the level shifter 30, the clock pulse signal generation circuit 40, the timing counter 50, the arbitration circuit 60, the read buffer 70, the event time register 80, and the interface circuit 90.

The oscillation circuit 10 is electrically coupled to both ends of the resonator 2 via terminals P3, P4 of the integrated circuit 3, and amplifies the output signal of the resonator 2 and then feeds back the result to thereby oscillate the resonator 2 to output a source clock signal CK0.

The frequency divider circuit 20 divides the frequency of the source clock signal CK0 to thereby generate a clock signal CK1 having a desired frequency. For example, the frequency divider circuit 20 can be a ripple counter having a plurality of flip-flops coupled in series to each other.

In the present embodiment, the oscillation circuit 10 and the frequency divider circuit 20 operate at relatively high speed compared to the other circuits. Therefore, the oscillation circuit 10 and the frequency divider circuit 20 operate with the power supply voltage VOSC lower than the power supply voltage VLOGIC so that the power consumption of the oscillation circuit 10 and the frequency divider circuit 20 is reduced.

To the level shifter 30, there is input the clock signal CK1, and the level shifter 30 outputs a clock signal CK2 obtained by converting the high level of the clock signal CK1 into the power supply voltage VLOGIC. The frequency of the clock signal CK2 is the same as the frequency of the clock signal CK1.

The clock pulse signal generation circuit 40 generates a clock pulse signal CKP for operating the timing counter 50 based on the clock signal CK2. The period of the clock pulse signal CKP is 1 sec. In the present embodiment, the clock pulse signal generation circuit 40 generates the clock pulse signal CKP having a first pulse width when there is a possibility that the interface circuit 90 receives an access signal from the master control device 6. Further, the clock pulse signal generation circuit 40 generates the clock pulse signal CKP having a second pulse width longer than the first pulse width when there is no possibility that the interface circuit 90 receives the access signal from the master control device 6.

As described above, in the present embodiment, the master control device 6 operates while being supplied with the power supply voltage VDD from the main power supply 4, and stops the operation when the supply of the power supply voltage VDD from the main power supply 4 is stopped. Therefore, while there is a possibility that the interface circuit 90 receives the access signal from the master control device 6 when the power supply voltage VDD is supplied from the main power supply 4, there is no possibility that the interface circuit 90 receives the access signal from the master control device 6 when the supply of the power supply voltage VDD from the main power supply 4 is stopped. Therefore, in the present embodiment, the clock pulse signal generation circuit 40 determines whether or not there is a possibility that the interface circuit 90 receives the access signal based on the power supply voltage VDD. Specifically, as shown in FIG. 2, the clock pulse signal generation circuit 40 determines that there is a possibility that the interface circuit 90 receives the access signal when the determination signal VDET is in the high level, namely when it has been determined by the power supply voltage determination circuit 110 that the power supply voltage VDD has been no lower than the voltage value VT. Further, the clock pulse signal generation circuit 40 determines that there is no possibility that the interface circuit 90 receives the access signal when the determination signal VDET is in the low level, namely when it has been determined by the power supply voltage determination circuit 110 that the power supply voltage VDD has been lower than the voltage value VT.

Further, the clock pulse signal generation circuit 40 generates a timing datum T0 shorter than 1 sec based on the clock signal CK2. The timing datum T0 can be a timing datum on, for example, the $\frac{1}{1000}$ sec time scale or the $\frac{1}{100}$ sec time scale.

Further, the clock pulse signal generation circuit 40 generates a guard signal GUARD which becomes active in a predetermined period including a period in which timing data T1 through T6 are updated by the timing counter 50 based on the clock signal CK2 and carry signals CA1 through CA5. In the present embodiment, the guard signal GUARD becomes in the high level in the predetermined period including the period in which the timing datum T0 and the timing data T1 through T6 described later are updated. It should be noted that the details of the clock pulse signal generation circuit 40 will be described later.

The timing counter 50 generates the timing data T1 through T6. In the present embodiment, the timing data generated by the timing counter 50 includes time information of the year, the month, the day, the hour, the minute, and the second. Specifically, the timing counter 50 has a second counter for performing timing on the second time scale, a minute counter for performing timing on the minute time scale, an hour counter for performing timing on the hour time scale, a day counter for performing timing on a daily basis, a month counter for performing timing on a monthly basis, and a year counter for performing timing on a yearly basis, and the counters generate the timing data T1 through T6 representing the year, the month, the day, the hour, the minute, and the second, respectively.

In the present embodiment, the timing counter 50 is an asynchronous counter, and the second counter performs timing based on the clock pulse signal CKP, and generates the carry signal CA1 every minute. The minute counter performs timing based on the carry signal CA1, and generates the carry signal CA2 every hour. The hour counter performs timing based on the carry signal CA2, and generates the carry signal CA3 every day. The day counter performs timing based on the carry signal CA3, and generates the carry signal CA4 every month. The month counter performs timing based on the carry signal CA4, and generates the carry signal CA5 every year. The year counter performs timing based on the carry signal CA5. It should be noted that the details of the timing counter 50 will be described later.

The read buffer 70 obtains and holds the timing data T1 through T6 generated by the timing counter 50 at predetermined timing generated a read clock signal RCK.

The write buffer 71 obtains and holds write data WDT1 through WDT6 output from the interface circuit 90 at predetermined timing respectively generated write clock signals WCK1 through WCK6. The write data WDT1 through WDT6 held by the write buffer 71 are output to the timing counter 50 as a time datum WDAT.

When the arbitration circuit 60 receives a write request signal WREQW, the arbitration circuit 60 identifies bytes as a writing target in the write buffer 71 based on a write address WADR. Then, the arbitration circuit 60 generates some or all of the write clock signals WCK1 through WCK6 in sequence to write some or all of the write data WDT1 through WDT6 in sequence in the bytes as the write target. Then, when the guard signal GUARD is in the low level, the arbitration circuit 60 generates a write clock signals WCK to write the bytes of the time datum WDAT output from the write buffer 71 into the counters of the time counter 50 in a lump. Further, when the guard signal GUARD is in the high level, the arbitration circuit 60 generates the write clock signals WCK to write the bytes of the time datum WDAT into the counters of the time counter 50 in a lump after the guard signal GUARD changes to the low level. As described above, the arbitration circuit 60 performs the arbitration so that the counters provided to the time counter 50 are not updated by the time datum WDAT when the guard signal GUARD is in the high level.

Further, when the guard signal GUARD is in the high level, the arbitration circuit 60 performs the arbitration so that there is not performed a time stamp in which a time datum TSTMP held by the event time register 80 is updated in accordance with an event signal EVIN input from a terminal P5 of the integrated circuit 3. Specifically, when the arbitration circuit 60 receives the event signal EVIN when the guard signal GUARD is in the low level, the arbitration circuit 60 generates a write clock signal EVCK to write timing data T0 through T6 into the event time register 80 to update the time datum TSTMP. Further, when the arbitration circuit 60 receives the event signal EVIN when the guard signal GUARD is in the high level, the arbitration circuit 60 generates the write clock signal EVCK after the guard signal GUARD changes to the low level to write the timing data T0 through T6 into the event time register 80 to update the time datum TSTMP.

Further, the arbitration circuit 60 performs the arbitration so that a time datum RDAT held by the read buffer 70 are not updated when the guard signal GUARD is in the high level. Specifically, when the arbitration circuit 60 receives a read request signal RREQ, the arbitration circuit 60 generates the read clock signal RCK to write the timing data T1 through T6 in the read buffer 70 to update the time datum RDAT when the guard signal GUARD is in the low level. Further, when the guard signal GUARD is in the high level, the arbitration circuit 60 does not generate the read clock signal RCK, but updates the time datum RDAT. It should be noted that the arbitration circuit 60 generates the read clock signal RCK to write the timing data T1 through T6 in the read buffer 70 to update the time datum RDAT immediately before the guard signal GUARD changes from the low level to the high level based on, for example, the timing datum T0. Therefore, when the guard signal GUARD is in the high level when the arbitration circuit 60 receives the read request signal RREQ, the read buffer 70 holds the timing data T1 through T6 which have not been updated by the carry as the time datum RDAT as a result.

The interface circuit 90 is an interface circuit for communication between the timer 1 and the master control device 6. In the present embodiment, the interface circuit 90 is an interface circuit compatible with the I²C (Inter-Integrated Circuit) bus, and communicates with the master control device 6 based on a serial clock signal SCL input via a terminal P6 of the integrated circuit 3, and a serial data signal SDA input/output via a terminal P7 of the integrated circuit 3. It should be noted that the interface circuit 90 can be an interface circuit compatible with other serial busses such as the SPI (Serial Peripheral Interface), or can also be an interface circuit compatible with a parallel bus.

The interface circuit 90 receives an access signal from the master control device 6 via the terminals P6, P7, and performs a variety of processes corresponding to the access signal thus received.

Specifically, when the interface circuit 90 has received the access signal requesting reading of the timing data T1 through T6, the interface circuit 90 generates the read request signal RREQ and outputs the read request signal RREQ to the arbitration circuit 60. Then, the interface circuit 90 reads the timing data T1 through T6 as the time datum RDAT held by the read buffer 70, and converts the timing data T1 through T6 into the serial data signal SDA to output the result to the master control device 6 via the terminal P7.

Further, when the interface circuit 90 has received the access signal requesting reading of the time datum TSTMP, the interface circuit 90 reads the timing data T0 through T6 as the time datum TSTMP held by the event time register 80, and converts the timing data T0 through T6 into the serial data signal SDA to output the result to the master control device 6 via the terminal P7.

Further, when the interface circuit 90 has received the access signal requesting rewriting of the timing data T1 through T6, the interface circuit 90 generates the write address WADR, the write request signal WREQ, and write data WDT1 through WDT6. Further, the interface circuit 90 outputs the write address WADR and the write request signal WREQ to the arbitration circuit 60, and outputs the write data WDT1 through WDT6 to the write buffer 71.

As described above, in the present embodiment, when the timing at which the timing counter 50 updates the timing data T1 through T6 and the timing at which the interface circuit 90 receives the access signal overlap each other, a high priority is put on the update of the timing data T1 through T6 due to the arbitration circuit 60 and the read buffer 70. Therefore, the timing counter 50 generates the timing data T1 through T6 with a predetermined period irrespective of whether or not the interface circuit 90 has received the access signal. As a result, the timing datum T0 and the timing data T1 through T6 are always prevented from being shifted from each other, and thus, the time stamp described above is realized.

1-2. Configuration of Timing Counter

Figure 3:
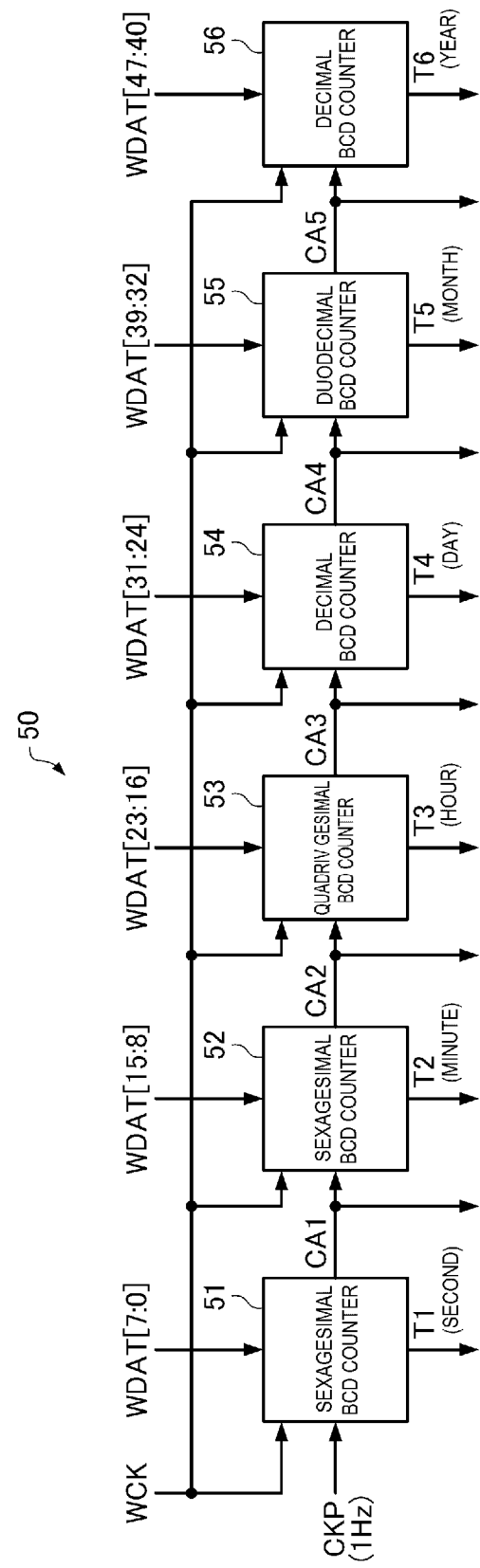
FIG. 3 is a diagram showing a configuration example of a timing counter.

FIG. 3 is a diagram showing a configuration example of the timing counter 50. As shown in FIG. 3, the timing counter 50 is provided with counters 51 through 56.

The counter 51 is the second counter, and performs the count operation in sync with the clock pulse signal CKP to thereby generate the count value representing the time on the second time scale. For example, the counter 51 is a sexagesimal BCD (Binary Coded Decimal) counter, and sequentially generates BCD count values representing 0 through 59 in decimal notation in sync with the pulses of the clock pulse signal CKP. When the count value becomes equal to a value representing 59 in decimal notation, the count value of the counter 51 is reset to 0 in sync with the subsequent pulse of the clock pulse signal CKP, and at the same time, outputs the carry signal CA1. The count value generated by the counter 51 is used as the timing datum T1 representing the time on the second time scale. In other words, the counter 51 updates the timing datum T1 on the second time scale. Further, the counter 51 updates the count value, namely the timing datum T1, to a value of one byte corresponding to a bit 0 through a bit 7 of the time datum WDAT in sync with the pulses of the write clock signal WCK.

The counter 52 is the minute counter, and performs the count operation in sync with the carry signal CA1 to thereby generate the count value representing the time on the minute time scale. For example, the counter 52 is a sexagesimal (base 60) BCD counter, and sequentially generates the BCD count values representing 0 through 59 in decimal notation in sync with the pulses of the carry signal CA1. When the count value becomes equal to a value representing 59 in decimal notation, the count value of the counter 52 is reset to 0 in sync with the subsequent pulse of the carry signal CA1, and at the same time, outputs the carry signal CA2. The count value generated by the counter 52 is used as the timing datum T2 representing the time on the minute time scale. In other words, the counter 52 updates the timing datum T2 on the minute time scale. Further, the counter 52 updates the count value, namely the timing datum T2, to a value of one byte corresponding to a bit 8 through a bit 15 of the time datum WDAT in sync with the pulses of the write clock signal WCK.

The counter 53 is the hour counter, and performs the count operation in sync with the carry signal CA2 to thereby generate the count value representing the time on the hour time scale. For example, the counter 53 is a quadrivigesimal (base 24) BCD counter, and sequentially generates the BCD count values representing 0 through 23 in decimal notation in sync with the pulses of the carry signal CA2. When the count value becomes equal to a value representing 23 in decimal notation, the count value of the counter 53 is reset to 0 in sync with the subsequent pulse of the carry signal CA2, and at the same time, outputs the carry signal CA3. The count value generated by the counter 53 is used as the timing datum T3 representing the time on the hour time scale. In other words, the counter 53 updates the timing datum T3 on the hour time scale. Further, the counter 53 updates the count value, namely the timing datum T3, to a value of one byte corresponding to a bit 16 through a bit 23 of the time datum WDAT in sync with the pulses of the write clock signal WCK.

The counter 54 is the day counter, and performs the count operation in sync with the carry signal CA3 to thereby generate the count value representing the time on a daily basis. For example, the counter 54 is a decimal BCD counter, and sequentially generates the BCD count values representing 1 through 31 in decimal notation in sync with the pulses of the carry signal CA3. It should be noted that it is necessary to set the count value corresponding to the last day of the month to 28 or 30 depending on the month, and in the case of February in leap years, it is necessary to set the count value of the last day of the month to 29. Therefore, the counter 54 compares the count value representing the time on a daily basis with a count upper limit value set based on the count value representing the time on a monthly basis and the count value representing the time on a yearly basis. When the count value becomes equal to the count upper limit value, the count value of the counter 54 is reset to 1 in sync with the subsequent pulse of the carry signal CA3, and at the same time, outputs the carry signal CA4. The count value generated by the counter 54 is used as the timing datum T4 representing the time on a daily basis. In other words, the counter 54 updates the timing datum T4 on a daily basis. Further, the counter 54 updates the count value, namely the timing datum T4, to a value of one byte corresponding to a bit 24 through a bit 31 of the time datum WDAT in sync with the pulses of the write clock signal WCK.

The counter 55 is the month counter, and performs the count operation in sync with the carry signal CA4 to thereby generate the count value representing the time on a monthly basis. For example, the counter 55 is formed of a duodecimal BCD counter, and sequentially generates the BCD count values representing 1 through 12 in decimal notation in sync with the pulses of the carry signal CA4. When the count value becomes equal to a value representing 12 in decimal notation, the count value of the counter 55 is reset to 1 in sync with the subsequent pulse of the carry signal CA4, and at the same time, outputs the carry signal CA5. The count value generated by the counter 55 is used as the timing datum T5 representing the time on a monthly basis. In other words, the counter 55 updates the timing datum T5 on a monthly basis. Further, the counter 55 updates the count value, namely the timing datum T5, to a value of one byte corresponding to a bit 32 through a bit 39 of the time datum WDAT in sync with the pulses of the write clock signal WCK.

The counter 56 is the year counter, and performs the count operation in sync with the carry signal CA5 to thereby generate the count value representing the time on a yearly basis. For example, the counter 56 is formed of a decimal BCD counter, and sequentially generates the BCD count values representing the last two digits of 2015, 2016, 2017, . . . in decimal notation in the case of Christian years in sync with the pulses of the carry signal CA5. The count value generated by the counter 56 is used as the timing datum T6 representing the time on a yearly basis. In other words, the counter 56 updates the timing datum T6 on a yearly basis. Further, the counter 56 updates the count value, namely the timing datum T6, to a value of one byte corresponding to a bit 40 through a bit 47 of the time datum WDAT in sync with the pulses of the write clock signal WCK.

As described above, in the present embodiment, the timing counter 50 is an asynchronous counter, and the counter 51 performs the count operation based on the clock pulse signal CKP, and generates the carry signal CA1 every minute. The counter 52 performs the count operation based on the carry signal CA1, and generates the carry signal CA2 every hour. The counter 53 performs the count operation based on the carry signal CA2, and generates the carry signal CA3 every day. The counter 54 performs the count operation based on the carry signal CA3, and generates the carry signal CA4 every month. The counter 55 performs the count operation based on the carry signal CA4, and generates the carry signal CA5 every year. The counter 56 performs the count operation based on the carry signal CA5.

Figure 4:
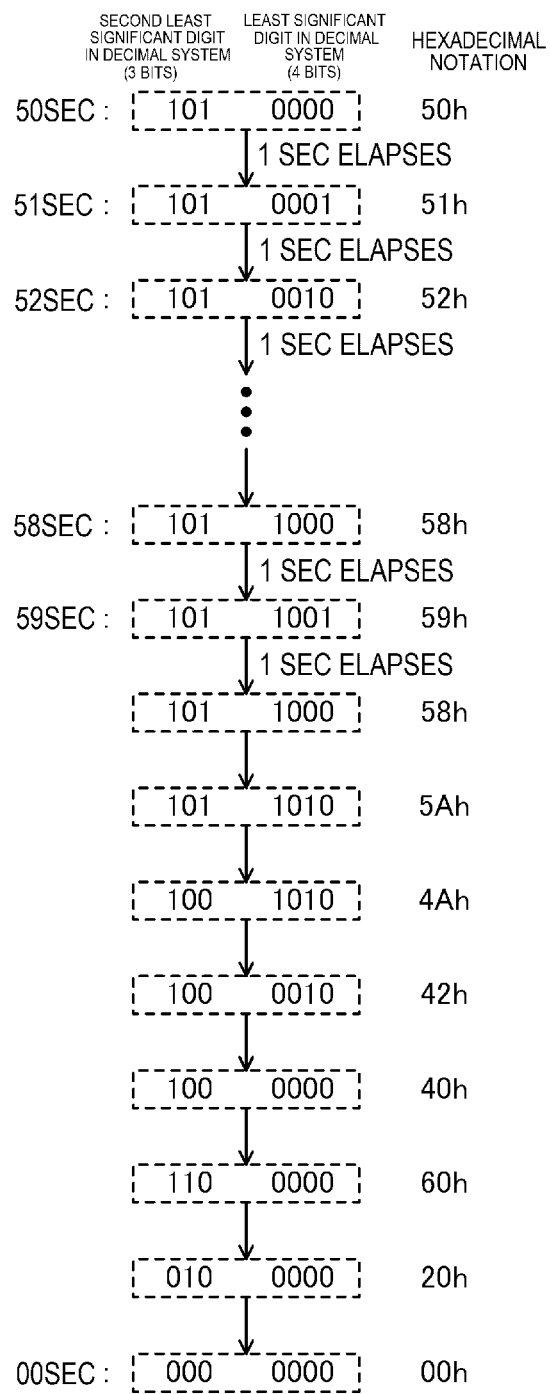
FIG. 4 is a diagram showing an example of a counting operation of a counter.

FIG. 4 is a diagram showing an example of the count operation of the counter 51 for outputting the timing datum T1 representing the time on the second time scale. As shown in FIG. 4, the high 3 bits of the timing datum T1 correspond to the second least significant digit in the decimal system of 00 sec through 59 sec, and the low 4 bits of the timing datum T1 correspond to the least significant digit in the decimal system of 00 sec through 59 sec. In the example shown in FIG. 4, the timing datum T1 takes one of values from 51h through 59h every time one sec elapses from the state of 50h in the hexadecimal notation. Then, when the clock pulse signal CKP changes from the low level to the high level when the timing datum T1 is 59h, the timing datum T1 changes in the low 4 bits in the order of, for example, 59h→58h→5Ah. Then, the carry from the low 4 bits in the timing datum T1 occurs, and at the same time, the low 4 bits are sequentially cleared, and thus, the timing datum T1 changes in the order of, for example, 5Ah→4Ah→42h→40h→60h. Then, the high 3 bits in the timing datum T1 is sequentially cleared, and thus, the timing datum T1 changes in the order of, for example, 60h→20h→00h. As described above, in the example shown in FIG. 4, the timing datum T1 changes from 59h to 00h through 8 times of change in the transition from 59 sec to 00 sec. It should be noted that the carry signal CA1 occurs when the timing datum T1 changes from 60$h$ to 20$h$.

In the present embodiment, the update of the timing datum T1 is allowed in the period in which the clock pulse signal CKP is in the high level. As shown in FIG. 4, the time required for the update of the timing datum T1 is the longest in the update of the timing datum T1 from 59h to 00h in which the carry, clearing of the bit, and so on occur the largest number of times. Therefore, it is necessary for the pulse width of the clock pulse signal CKP to be longer than the time necessary for the update of the timing datum T1 from 59h to 00h. Similarly, it is necessary for the pulse widths of the carry signals CA1 through CA5 to be longer than the maximum time necessary for the update of the timing data T2 through T6, respectively.

1-3. Configuration of Clock Pulse Signal Generation Circuit

Figure 5:
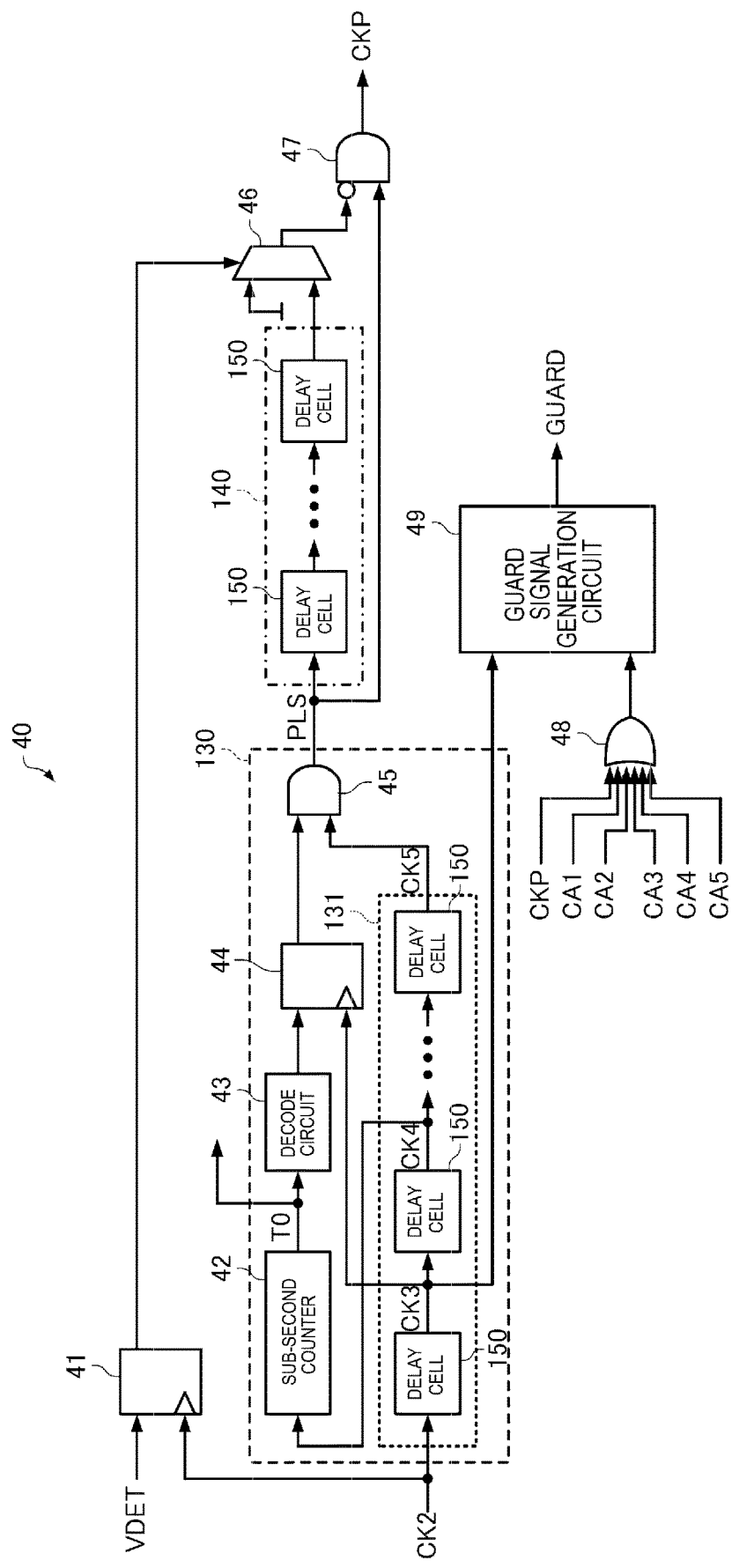
FIG. 5 is a diagram showing a configuration example of a clock pulse signal generation circuit.

FIG. 5 is a diagram showing a configuration example of the clock pulse signal generation circuit 40. As shown in FIG. 5, the clock pulse signal generation circuit 40 is provided with delay circuits 131, 140.

The delay circuit 131 outputs clock signals CK3, CK4, and CK5 obtained by delaying the clock signal CK2. Further, the delay circuit 140 outputs a signal obtained by delaying a pulse signal PLS.

Figure 6:
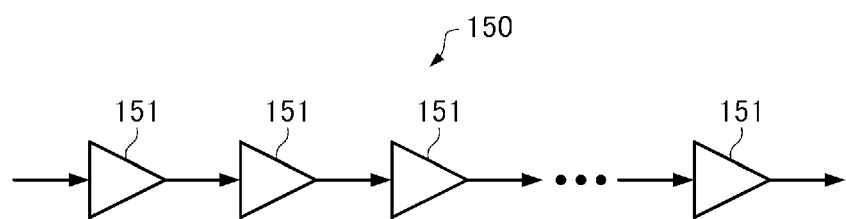
FIG. 6 is a diagram showing a configuration example of a delay cell.

The delay circuits 131, 140 are each constituted by a plurality of delay cells 150 coupled in series to each other. The number of the delay cells 150 constituting the delay circuit 131 and the number of the delay cells 150 constituting the delay circuit 140 can be the same as, or can also be different from each other. As shown in FIG. 6, each of the delay cells 150 is constituted, for example, by a plurality of buffer elements 151 coupled in series to each other. The delay time until the signal input to the delay cell 150 is output from the delay cell 150 is, for example, several tens of nanoseconds. It should be noted that since it is sufficient for the delay cell 150 to delay the signal input to the delay cell 150 and then output the result, the delay cell 150 is not limited to the configuration shown in FIG. 6, but can be, for example, an RC time constant circuit using a resistive element and a capacitive element.

Since the delay circuit 131 is constituted by the plurality of delay cells 150 coupled in series to each other, the delay time until the clock signal CK2 input to the delay circuit 131 is output from the delay circuit 131 as the clock signal CK5 is, for example, several hundreds of nanoseconds. Similarly, since the delay circuit 140 is constituted by the plurality of delay cells 150 coupled in series to each other, the delay time until the pulse signal PLS input to the delay circuit 140 is output from the delay circuit 140 is, for example, several hundreds of nanoseconds.

Further, as shown in FIG. 5, the clock pulse signal generation circuit 40 is provided with a flip-flop 41, a sub-second counter 42, a decode circuit 43, a flip-flop 44, an AND circuit 45, a selector 46, a logic circuit 47, an OR circuit 48, and a guard signal generation circuit 49.

The flip-flop 41 acquires and holds the determination signal VDET every rising of the pulse of the clock signal CK2. The flip-flop 41 plays a role of synchronizing the determination signal VDET, which is asynchronous with the clock signal CK2, with the clock signal CK2.

The sub-second counter 42 divides the frequency of the clock signal CK4 output from the delay cell 150 in the second stage of the delay circuit 131 into 1 Hz to thereby output the count value in M bits. This count value is output from the clock pulse signal generation circuit 40 as the timing datum T0 shorter than 1 sec. For example, when the frequency of the clock signal CK4, namely the frequency of the clock signal CK2, is 1024 Hz, the sub-second counter 42 outputs the timing datum T0 in 10 bits on the substantially $\frac{1}{1000}$ sec time scale.

The decode circuit 43 decodes the timing datum T0 to output a signal which becomes in the high level when the timing datum T0 coincides with a predetermined value, and becomes in the low level when the timing datum T0 fails to coincide with the predetermined value. When the timing datum T0 is the data in 10 bits on the substantially $\frac{1}{1000}$ sec time scale, for example, there is output the signal which becomes in the high level when the timing datum T0 coincides with 3FFh in the hexadecimal notation, and becomes in the low level when the timing datum T0 fails to coincide with 3FFh in the hexadecimal notation. The length of the period in which the output signal of the decode circuit 43 is in the high level coincides with the length of one cycle of the clock signal CK2.

The flip-flop 44 acquires and holds the output signal of the decode circuit 43 every rising of the pulse of the clock signal CK3 output from the delay cell 150 in the first stage of the delay circuit 131. Since the length of the period in which the output signal of the decode circuit 43 is in the high level coincides with the length of one cycle of the clock signal CK2, the length of the period in which the output signal of the flip-flop 44 is in the high level also coincides with the length of one cycle of the clock signal CK2. Therefore, for example, when the frequency of the clock signal CK2 is 1024 Hz, the length of the period in which the output signal of the flip-flop 44 is in the high level is about 1000 μs.

To the AND circuit 45, there are input the output signal of the flip-flop 44 and the clock signal CK5 output from the delay cell 150 in the final stage of the delay circuit 131, and the AND circuit 45 outputs the pulse signal PLS as the AND signal of the output signal of the flip-flop 44 and the clock signal CK5. Since the length of the period in which the output signal of the flip-flop 44 is in the high level coincides with the length of one cycle of the clock signal CK2, and the length of the period in which the clock signal CK5 is in the high level coincides with the length of a half cycle of the clock signal CK2, the length of the period in which the pulse signal PLS is in the high level, namely the pulse width of the pulse signal PLS, coincides with the length of a half cycle of the clock signal CK2. Therefore, for example, when the frequency of the clock signal CK2 is 1024 Hz, the pulse width of the pulse signal PLS is about 500 μs.

As described above, the sub-second counter 42, the decode circuit 43, the flip-flop 44, the AND circuit 45, and the delay circuit 131 constitute a pulse signal generation circuit 130 for generating the pulse signal PLS based on the clock signal CK2 as a signal obtained by dividing the frequency of the source clock signal CK0. The pulse signal PLS is input to the delay circuit 140, and the signal obtained by delaying the pulse signal PLS as much as several hundreds of nanoseconds is output from the delay circuit 140.

To the selector 46, there are input the output signal of the delay circuit 140 and a signal with a constant voltage, and the selector 46 selects and outputs the output signal of the delay circuit 140 or the signal with the constant voltage based on the output signal of the flip-flop 41. In the present embodiment, the signal with the constant voltage to be input to the selector 46 is a signal with the ground voltage, namely a signal in the low level. Then, when the output signal of the flip-flop 41 is in the low level, the selector 46 selects and outputs the signal with the constant voltage, namely the signal in the low level. Further, when the output signal of the flip-flop 41 is in the high level, the selector 46 selects and outputs the output signal of the delay circuit 140.

To the logic circuit 47, there are input the output signal of the selector 46 and the pulse signal PLS, and the logic circuit 47 outputs the AND signal of a logical inversion signal of the output signal of the selector 46 and the pulse signal PLS. The output signal of the logic circuit 47 is output from the clock pulse signal generation circuit 40 as the clock pulse signal CKP.

Here, the output signal of the flip-flop 41 is the signal obtained by synchronizing the determination signal VDET with the clock signal CK2, and is therefore basically the same in logic level as the determination signal VDET. Further, when the determination signal VDET is in the low level, there is established the state in which the power supply voltage VBAT is selected as the power supply voltage VOUT, and when the determination signal VDET is in the high level, there is established the state in which the power supply voltage VDD is selected as the power supply voltage VOUT.

Therefore, in the state in which the power supply voltage VBAT is selected as the power supply voltage VOUT, the selector 46 selects and outputs the signal in the low level, and the logic circuit 47 outputs the pulse signal PLS as the clock pulse signal CKP having a first pulse width. In other words, the clock pulse signal CKP having the first pulse width is a signal output from the logic circuit 47 when the selector 46 selects and outputs the signal output from the delay circuit 140. The first pulse width is decided by the pulse width of the pulse signal PLS, and is, for example, about 500 µs.

Further, in the state in which the power supply voltage VDD is selected as the power supply voltage VOUT, the selector 46 selects and outputs the output signal of the delay circuit 140, and the logic circuit 47 outputs a differential signal of the pulse signal PLS as the clock pulse signal CKP having a second pulse width. In other words, the clock pulse signal CKP having the second pulse width is a signal output from the logic circuit 47 when the selector 46 selects and outputs the signal with the constant voltage. The second pulse width is decided by the delay time of the delay circuit 140, and is, for example, several hundreds of nanoseconds. As described above, although it is necessary for the pulse width of the clock pulse signal CKP to be longer than the maximum time necessary for the update of the timing datum T1, the maximum time necessary for the update of the timing datum T1 is, for example, no more than 100 ns, and there is no problem as long as the pulse width of the clock pulse signal CKP is several hundreds of nanoseconds.

To the OR circuit 48, there are input the carry signals CA1 through CA5, and the OR circuit 48 outputs an OR signal of the carry signals CA1 through CA5. In the present embodiment, the period in which the clock pulse signal CKP is in the high level and the periods in which the carry signals CA1 through CA5 are in the high level, respectively, overlap each other, the output signal of the OR circuit 48 changes from the low level to the high level due to the clock pulse signal CKP changing from the low level to the high level, and then, keeps the high level, and changes from the high level to the low level due to the carry signal CA5 changing from the high level to the low level.

The guard signal generation circuit 49 generates the guard signal GUARD based on the clock signal CK3 and the output signal of the OR circuit 48. Specifically, the guard signal GUARD changes from the low level to the high level at the timing at which the clock signal CK3 changes from the low level to the high level. Subsequently, the guard signal GUARD keeps the high level, and the guard signal GUARD changes from the high level to the low level at the timing at which the output signal of the OR circuit 48 changes from the high level to the low level. In other words, the guard signal GUARD becomes in the high level in at least the period from when the sub-second counter 42 starts the count operation to when the timing counter 50 completes the count operation. Therefore, as described above, the guard signal GUARD becomes in the high level in the predetermined period including the period in which the timing data T0 through T6 are updated.

1-4. Operation Timing of Timer

Figure 7:
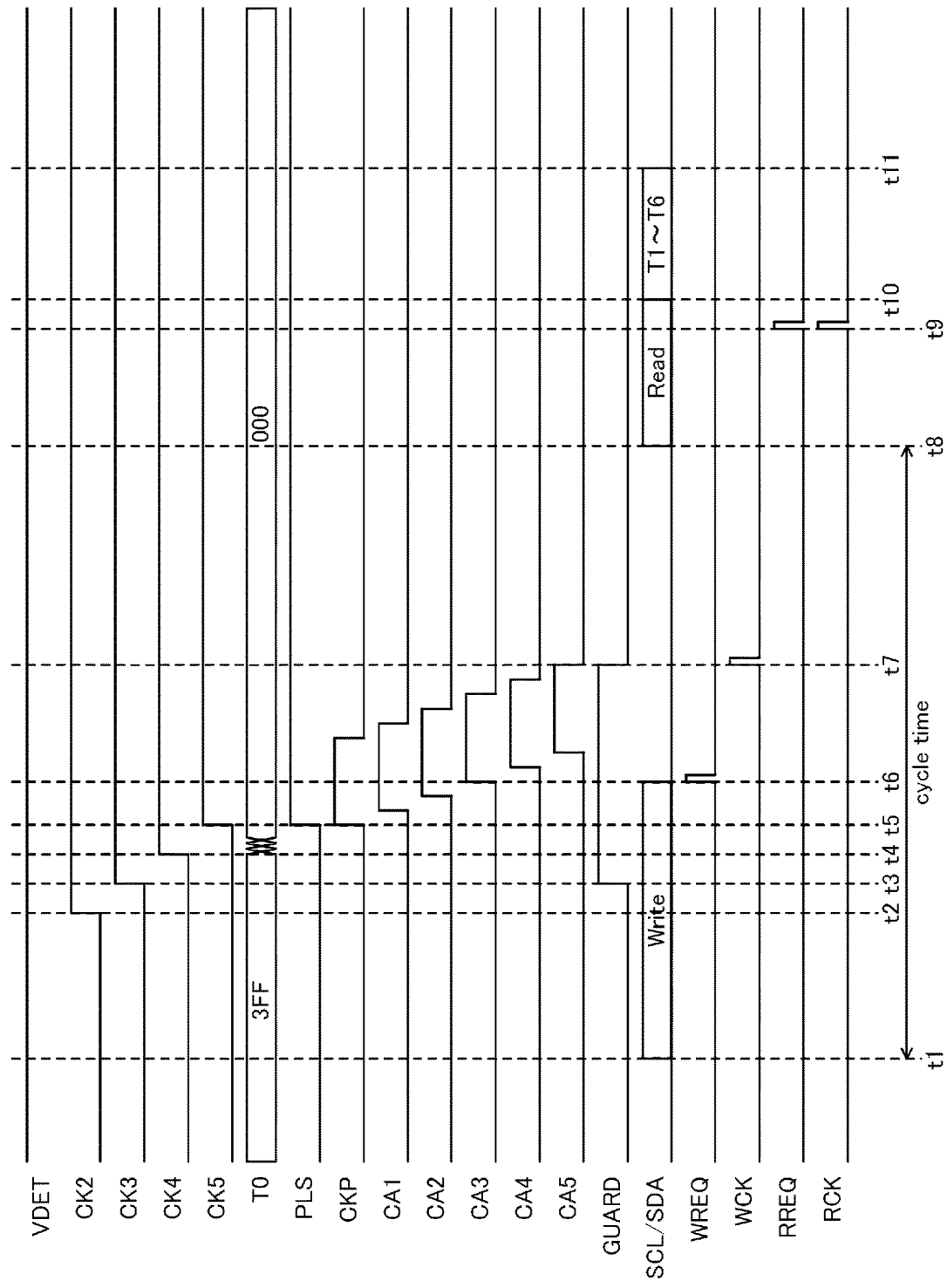
FIG. 7 is a timing chart showing an example of waveforms of a variety of signals when the timer performs a timing operation with a main power supply.

FIG. 7 is a timing chart showing an example of waveforms of a variety of signals when the timer 1 performs the timing operation with the main power supply 4. The example shown in FIG. 7 shows when the update timing of the timing data T1 through T6 and the access signal from the master control device 6 temporally overlap each other.

At the time t1 through time t6, the interface circuit 90 receives the access signal requesting rewriting of the timing data T1 through T6, and at the time t6, the write request signal WREQ is generated.

The clock signal CK2 changes from the low level to the high level at the time t2 prior to the time t6, and at the time t3, the clock signal CK3 changes from the low level to the high level, and the guard signal GUARD changes from the low level to the high level.

At the time t4, the clock signal CK4 changes from the low level to the high level, and the sub-second counter 42 starts the timing operation to make the value of the timing datum T0 start to change.

At the time t5, the clock signal CK5 changes from the low level to the high level, and thus, the pulse signal PLS changes from the low level to the high level, and the clock pulse signal CKP having the first pulse width is generated.

Subsequently, the carry signals CA1 through CA5 are sequentially generated, and at the time t7, the guard signal GUARD changes from the high level to the low level. At the time t6, the write request signal WREQ is generated, but the write clock signal WCK is not generated since the guard signal GUARD is in the high level, and at the time t7 at which the guard signal GUARD changes from the high level to the low level, some or all of the pulses of the write clock signal WCK are generated. In other words, after the update of the timing data T1 through T6 at the time t5 through the time t7 is completed, rewriting of the timing data T1 through T6 is performed.

Further, at the time t8 through the time t10, the interface circuit 90 receives the access signal requesting reading of the timing data T1 through T6.

At the time t9, the read request signal RREQ is generated, and thus, the read clock signal RCK is generated, and the time datum RDAT held in the read buffer 70 is updated to the latest timing data T1 through T6 thus rewritten. Then, at the time t10 through the time t11, the interface circuit 90 reads the time datum RDAT held in the read buffer 70, and then converts the time datum RDAT into the serial datum SDA to transmit the result to the master control device 6.

In general, as one of AC specifications of the timer 1, there is specified the cycle time which is the minimum time from when the timer 1 receives the access signal to when the timer 1 receives the next access signal. In the example shown in FIG. 7, the cycle time corresponds to the minimum time from the time t1 at which the timer 1 starts to receive the access signal requesting rewriting of the timing data T1 through T6 to the time t8 at which the timer 1 starts to receive the access signal requesting reading of the timing data T1 through T6. When the pulse width as the period in which the guard signal GUARD is in the high level is longer than the cycle time of the access signal, in contrast to the example shown in FIG. 7, there is a possibility that rewriting of the timing data T1 through T6 is performed after the interface circuit 90 transmits the timing data T1 through T6 to the master control device 6, and the master control device 6 reads the wrong timing data T1 through T6. Therefore, it is necessary for the pulse width of the guard signal GUARD to be shorter than the cycle time of the access signal. Since the first pulse width of the clock pulse signal CKP is shorter than the pulse width of the guard signal GUARD, it is necessary for the first pulse width to be shorter than the cycle time of the access signal. It should be noted that in the present embodiment, the pulse width of each of the carry signals CA1 through CA5 is made shorter than the cycle time of the access signal so that the pulse width of the guard signal GUARD becomes shorter than the cycle time of the access signal.

As described above, in the example shown in FIG. 7, since the determination signal VDET is in the high level, and there is a possibility that the interface circuit 90 receives the access signal from the master control device 6, the clock pulse signal generation circuit 40 generates the clock pulse signal CKP having the first pulse width shorter than the cycle time of the access signal. Further, the timing counter 50 generates the carry signals CA1 through CA5 each having the first pulse width. Then, the clock pulse signal generation circuit 40 generates the guard signal GUARD having a shorter pulse width than the cycle time of the access signal based on the clock pulse signal CKP and the carry signals CA1 through CA5. Therefore, after the timing data T1 through T6 are updated due to the timing operation by the timing counter 50, rewriting of the timing data T1 through T6 in accordance with the access signal of requesting rewriting of the timing data T1 through T6 is performed, the timing data T1 through T6 which have been rewritten are held by the read buffer 70 in accordance with the access signal of requesting reading of the timing data T1 through T6, and the timing data T1 through T6 which have been rewritten are correctly read from the read buffer 70.

It should be noted that in the example shown in FIG. 7, although there is no problem when the guard signal GUARD changes from the low level to the high level at the time t5 instead of the time t3 with respect to the access signal from the master control device 6, when the event signal EVIN is generated and the time stamp is performed during the transition of the value of the timing datum T0 at the time t3 through the time t5, there is a possibility that the time datum TSTMP held by the event time register 80 is updated to the wrong timing data T0 through T6. Therefore, in the present embodiment, it is arranged that the guard signal GUARD becomes in the high level also in the period in which the timing datum T0 is updated, and the time stamp is performed after the guard signal GUARD becomes in the low level.

Figure 8:
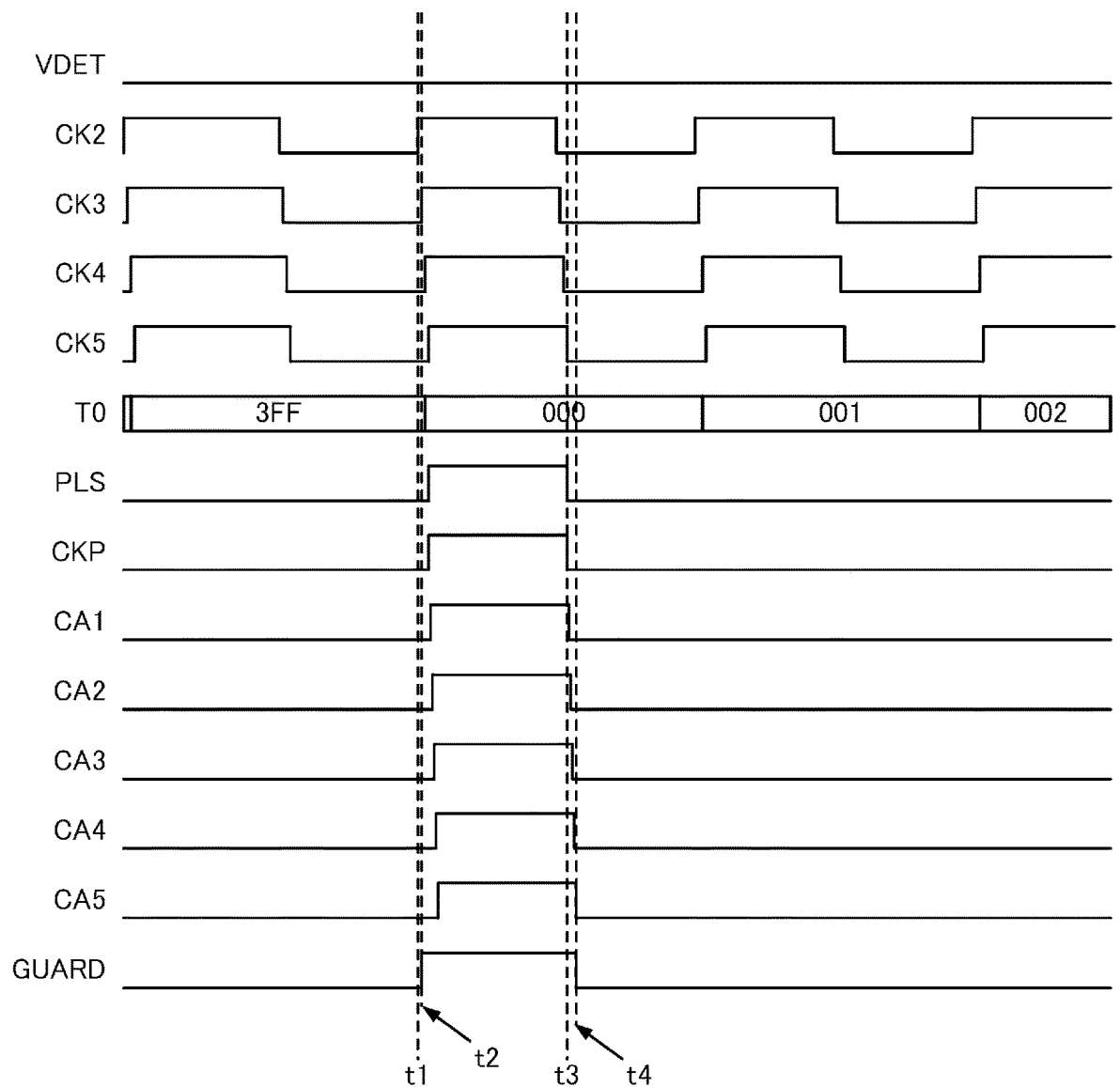
FIG. 8 is a timing chart showing an example of waveforms of a variety of signals when the timer performs a timing operation with a backup power supply.

FIG. 8 is a timing chart showing an example of the waveforms of the variety of signals when the timer 1 performs the timing operation with the backup power supply 5.

The clock signal CK2 changes from the low level to the high level at the time t1, and at the time t2, the clock signal CK3 changes from the low level to the high level, and the guard signal GUARD changes from the low level to the high level.

Subsequently, the clock signal CK4 changes from the low level to the high level, and the sub-second counter 42 starts the timing operation to change the value of the timing datum T0. Further, the clock signal CK5 changes from the low level to the high level, and thus, the pulse signal PLS changes from the low level to the high level, and the clock pulse signal CKP having the first pulse width is generated.

Subsequently, the carry signals CA1 through CA5 are sequentially generated, and at the time t3, the clock signal CK5 changes from the high level to the low level, and thus, the pulse signal PLS changes from the high level to the low level. Then, at the time t4, the guard signal GUARD changes from the high level to the low level.

As described above, in the example shown in FIG. 8, since the determination signal VDET is in the low level, and there is no possibility that the interface circuit 90 receives the access signal from the master control device 6, the clock pulse signal generation circuit 40 generates the clock pulse signal CKP having the second pulse width longer than the cycle time of the access signal. Further, the timing counter 50 generates the carry signals CA1 through CA5 each having the second pulse width.

Here, since the determination signal VDET is in the low level, the power supply voltage VBAT supplied from the backup power supply 5 is selected as the power supply voltage VOUT, and as described above, when the power supply voltage VOUT is lower than the predetermined voltage value, the power supply voltage VLOGIC supplied to the timing counter 50 follows the power supply voltage VOUT. Therefore, when the power supply voltage VBAT is lower than the predetermined voltage value, since the timing counter 50 is supplied with the power supply voltage VLOGIC lower than the predetermined voltage value, the speed of the timing operation slows. Therefore, it is necessary for the second pulse width to have a sufficient length so that the timing counter 50 can surely generate the timing data T1 through T6 even when the timing speed slows. In the present embodiment, the second pulse width corresponds to a value obtained by multiplying the period of the source clock signal CK0 by 2 to the N-th power wherein N represents a natural number. In the example shown in FIG. 8, the second pulse width coincides with the length of a half cycle of the clock signal CK2, and for example, when the frequency of the source clock signal CK0 is 32768 Hz, and the frequency of the clock signal CK2 is 1024 Hz, the second pulse width is obtained by multiplying the period of the source clock signal CK0 by 2 to the fourth power, and is about 500 μs. Therefore, it is possible for the timing counter 50 to surely generate the timing data T1 through T6. Further, since the clock pulse signal CKP having the second pulse width obtained by multiplying the period of the source clock signal CK0 by 2 to the N-th power can easily be generated using the frequency division signal of the source clock signal CK0, the circuit area of the clock pulse signal generation circuit 40 is reduced.

1-5. Functions and Advantages

As described hereinabove, the timer 1 according to the present embodiment is the asynchronous counter, and is provided with the timing counter 50 for generating the timing data T1 through T6, the clock pulse signal generation circuit 40 for generating the clock pulse signal CKP for operating the timing counter 50, and the interface circuit 90 for receiving the access signal. The clock pulse signal generation circuit 40 generates the clock pulse signal CKP having the first pulse width when there is a possibility that the interface circuit 90 receives the access signal, and generates the clock pulse signal CKP having the second pulse width longer than the first pulse width when there is no possibility that the interface circuit 90 receives the access signal. Therefore, according to the timer 1 related to the present embodiment, since it is possible for the timing counter 50 to complete the timing operation in a short time based on the clock pulse signal CKP having the first pulse width when there is a possibility that the interface circuit 90 receives the access signal, it is possible to cope with the fast access from the master control device 6 as an external device. Further, according to the timer 1 related to the present embodiment, since it is possible for the timing counter 50 to surely complete the timing operation based on the clock pulse signal CKP having the second pulse width longer than the first pulse width when there is no possibility that the interface circuit 90 receives the access signal, it is possible to reduce the possibility that the wrong timing data T1 through T6 are generated.

Further, according to the timer 1 related to the present embodiment, since the first pulse width of the clock pulse signal CKP is shorter than the cycle time of the access signal, even when the interface circuit 90 continuously receives the access signal, the order of the process performed on the timing data T1 through T6 in accordance with the first access signal and the process performed on the timing data T1 through T6 in accordance with the second access signal is kept, and therefore, it is possible to reduce the possibility that the wrong timing data T1 through T6 are generated.

Further, according to the timer 1 related to the present embodiment, since the second pulse width of the clock pulse signal CKP has the length obtained by multiplying the period of the source clock signal CK0 by 2 to the N-th power, and can therefore easily be generated using the frequency division signal of the source clock signal CK0, the circuit area of the clock pulse signal generation circuit 40 is reduced.

Further, in the timer 1 according to the present embodiment, the clock pulse signal generation circuit 40 determines whether or not there is a possibility that the interface circuit 90 receives the access signal based on the power supply voltage VDD commonly supplied to the timer 1 and the master control device 6. Specifically, the clock pulse signal generation circuit 40 determines that there is a possibility that the interface circuit 90 receives the access signal when the power supply voltage determination circuit 110 has determined that the power supply voltage VDD is no lower than the predetermined voltage value, and determines that there is no possibility that the interface circuit 90 receives the access signal when the power supply voltage determination circuit 110 has determined that the power supply voltage VDD is lower than the predetermined voltage value. Therefore, according to the timer 1 related to the present embodiment, the clock pulse signal generation circuit 40 can determine whether or not the master control device 6 is in operation based on whether or not the power supply voltage VDD is supplied from the main power supply 4, and can therefore determine whether or not there is a possibility that the interface circuit 90 receives the access signal from the master control device 6.

Further, the timer 1 according to the present embodiment is provided with the power supply voltage selection circuit 100 which selects the power supply voltage VDD when the power supply voltage determination circuit 110 has determined that the power supply voltage VDD is no lower than the predetermined voltage value, and selects the power supply voltage VBAT when the power supply voltage determination circuit 110 has determined that the power supply voltage VDD is lower than the predetermined voltage value. Therefore, according to the timer 1 related to the present embodiment, even when the supply of the power supply voltage VDD from the main power supply 4 stops, it is possible for the timing counter 50 to continue the timing operation based on the power supply voltage VBAT supplied from the backup power supply 5. Further, although the timing operation of the timing counter 50 slows when the timing counter 50 is supplied with the power supply voltage VBAT lower than the power supply voltage VDD, since the clock pulse signal generation circuit 40 generates the clock pulse signal CKP having the second pulse width longer than the first pulse width, the possibility that the wrong timing data T1 through T6 are generated is reduced. Further, since it is sufficient for the clock pulse signal generation circuit 40 to generate the clock pulse signal CKP having the first pulse width when the timing counter 50 performs the timing operation with the power supply voltage VDD higher than the power supply voltage VBAT, there is no need to provide an excessive length to the first pulse width assuming that the timing counter 50 performs the timing operation with the power supply voltage VBAT, and it is possible to suppress the number of the delay cells 150 constituting the delay circuit 140 to a minimum. As a result, the chip area of the integrated circuit 3 is reduced, and at the same time, the current consumption occurring when the pulse signal PLS propagates the plurality of delay cells 150 is reduced. Further, since the current consumption is reduced, the fluctuation of the power supply voltage VOUT is reduced which leads to a stable operation of the integrated circuit 3. Further, since the number of the delay cells 150 is reduced, the risk of the false operation of the integrated circuit 3 due to the individual variation in the delay cells 150 is reduced, and at the same time, the test time for the integrated circuit 3 is reduced.

Further, according to the timer 1 related to the present embodiment, since the power supply voltage determination circuit 110 which is used to determine switching between the power supply voltage VDD and the power supply voltage VBAT can also be used to determine that there is no possibility that the interface circuit 90 receives the access signal, it is possible to reduce the size of the integrated circuit 3.

Further, in the timer 1 according to the present embodiment, the clock pulse signal generation circuit 40 has the pulse signal generation circuit 130 for generating the pulse signal PLS based on the signal obtained by dividing the frequency of the source clock signal CK0, the delay circuit 140 for outputting the signal obtained by delaying the pulse signal PLS, the selector 46 for selecting and outputting one of the output signal of the delay circuit 140 and the signal having the constant voltage, and the logic circuit 47 to which the output signal of the selector 46 and the pulse signal PLS are input. Further, the clock pulse signal CKP having the first pulse width is the signal output from the logic circuit 47 when the selector 46 selects and outputs the signal output from the delay circuit 140, and the clock pulse signal CKP having the second pulse width is the signal output from the logic circuit 47 when the selector 46 selects and outputs the signal having the constant voltage. Therefore, according to the timer 1 related to the present embodiment, it is possible to realize the clock pulse signal generation circuit 40 with a simple circuit.

Further, the timer 1 according to the present embodiment is provided with the read buffer 70 for obtaining and holding the timing data T1 through T6 generated by the timing counter 50 at the predetermined timings. Further, when the interface circuit 90 receives the access signal requiring reading of the timing data T1 through T6, the interface circuit 90 outputs the timing data T1 through T6 held by the read buffer 70, and the timing counter 50 generates the timing data T1 through T6 at the predetermined timings irrespective of whether or not the interface circuit 90 has received the access signal. Therefore, according to the timer 1 related to the present embodiment, it is possible for the master control device 6 to read the timing data T1 through T6 from the read buffer 70 while the timing counter 50 does not stop the timing operation. Further, according to the timer 1 related to the present embodiment, since there is no chance for the timing datum T0 shorter than 1 sec generated by the clock pulse signal generation circuit 40 and the timing data T1 through T6 no shorter than 1 sec generated by the timing counter 50 to be shifted from each other, it is possible to realize the time stamp function of recording the time when the event signal EVIN occurs.

1-6. Modified Examples

For example, although in the embodiment described above, there is adopted the read buffer system in which the timing data T1 through T6 held by the read buffer 70 are read out when the interface circuit 90 has received the access signal, it is also possible to adopt an access holding system in which the timing operation of the timing counter 50 is temporarily stopped to read the timing data T1 through T6 from the timing counter 50 when the interface circuit 90 has received the access signal. Even when the access holding system is adopted, by the clock pulse signal generation circuit 40 generating the clock pulse signal CKP having the first pulse width shorter than the cycle time of the access signal, the timing data T1 through T6 which have been rewritten are correctly read out even when the access signal requiring rewriting of the timing data T1 through T6 and the access signal requiring reading of the timing data T1 through T6 are received in a row.

Further, the clock pulse signal generation circuit 40 determines whether or not there is a possibility that the interface circuit 90 receives the access signal based on the power supply voltage VDD in the embodiment described above, but can also make the determination using another method. For example, it is also possible for the interface circuit 90 to determine that there is a possibility that the access signal is received in the period between a start condition and a stop condition based on the serial clock signal SCL and the serial data signal SDA, and determine that there is no possibility that the access signal is received in the other periods. Further, when the interface circuit 90 is the interface circuit compatible with the SPI bus, it is possible to determine that there is a possibility that the access signal is received during the period in which a chip enable signal is in an active state, and to determine that there is no possibility that the access signal is received during the period in which the chip enable signal is an inactive state. Further, it is possible to adopt a configuration in which, for example, the timer 1 receives a control signal representing whether or not it is an access period separately from the access signal from the master control device 6, and the clock pulse signal generation circuit 40 determines whether or not there is a possibility that the interface circuit 90 receives the access signal based on the control signal.

2. Electronic Apparatus

Figure 9:
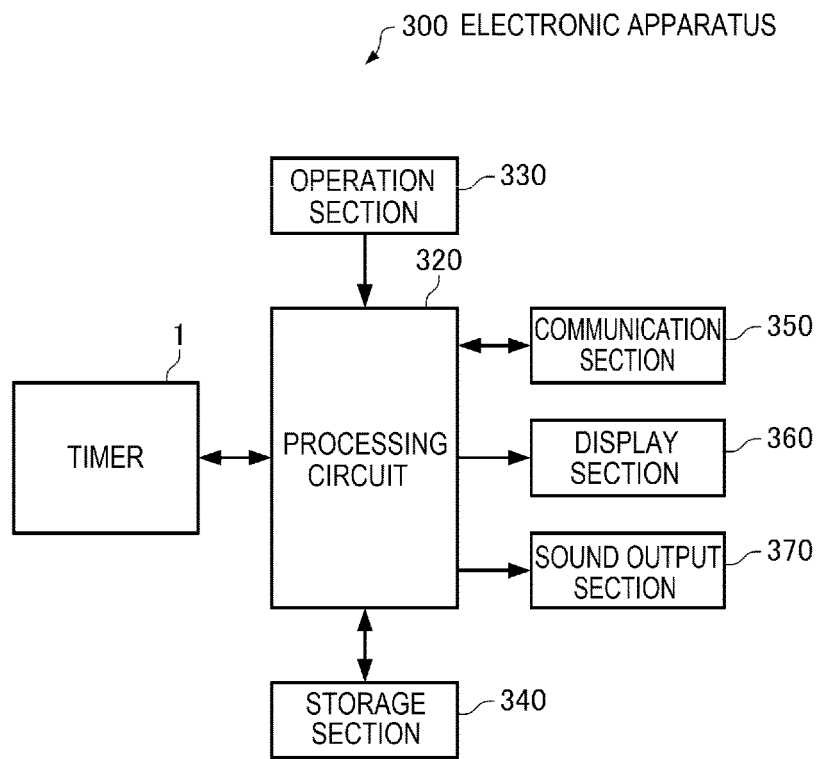
FIG. 9 is a functional block diagram of an electronic apparatus according to an embodiment.
Figure 10:
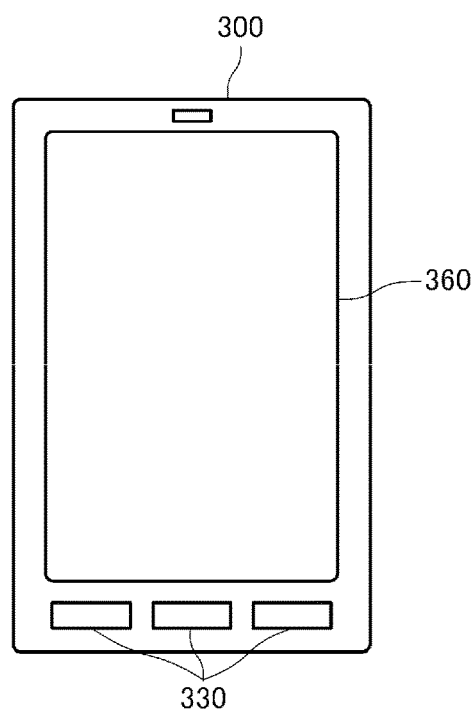
FIG. 10 is a diagram showing an example of an appearance of the electronic apparatus according to the embodiment.

FIG. 9 is a functional block diagram showing an example of a configuration of an electronic apparatus according to another embodiment using the timer 1 according to the present embodiment described above. Further, FIG. 10 is a diagram showing an example of an appearance of a smartphone as an example of the electronic apparatus according to the present embodiment.

The electronic apparatus 300 according to the present embodiment is configured including the timer 1, a processing circuit 320, an operation section 330, a storage section 340, a communication section 350, a display section 360, and a sound output section 370. It should be noted that the electronic apparatus 300 according to the present embodiment can be provided with a configuration obtained by omitting or modifying some of the constituents shown in FIG. 9, or adding other constituents thereto.

The processing circuit 320 performs a variety of calculation processes and control processes in accordance with programs stored in the storage section 340 and so on. Specifically, the processing circuit 320 performs a variety of processes corresponding to the operation signal from the operation section 330, a process of controlling the communication section 350 for performing data communication with external equipment, a process of transmitting a display signal for making the display section 360 display a variety of types of information, a process of transmitting a sound signal for making the sound output section 370 output a variety of sounds, and so on. Further, the processing circuit 320 operates based on an output signal from the timer 1. Specifically, the processing circuit 320 retrieves the timing data and so on from the timer 1 to perform the variety of calculation processes and control processes. Further, the processing circuit 320 performs rewriting of the timing data to the timer 1. The processing circuit 320 is realized by, for example, an MCU (Micro Controller Unit) or an MPU (Micro Processor Unit). It should be noted that the processing circuit 320 corresponds to the master control device 6 described above.

The operation section 330 is an input device constituted by operation keys, button switches, and so on, and outputs the operation signal corresponding to the operation by a user to the processing circuit 320. The processing circuit 320 is capable of setting the time information to the timer 1 in accordance with, for example, a signal input from the operation section 330.

The storage section 340 stores the programs, data, and so on for the processing circuit 320 to perform the variety of arithmetic processes and control processes. Further, the storage section 340 is used as a working area of the processing circuit 320, and temporarily stores the programs and the data retrieved from the storage section 340, the data input from the operation section 330, and the calculation result obtained by the processing circuit 320 performing operations in accordance with the variety of types of programs. The storage section 340 is configured including a ROM (Read Only Memory) and a RAM (Random Access Memory), and is realized by, for example, a hard disk, a flexible disk, MO, MT, a variety of types of memory, a CD-ROM, or a DVD-ROM.

The communication section 350 performs a variety of types of control for achieving the data communication between the processing circuit 320 and external devices.

The display section 360 is a display device formed of a LCD (Liquid Crystal Display) or the like, and displays a variety of types of information based on the display signal input from the processing circuit 320. The display section 360 can also be provided with a touch panel, which functions as the operation section 330.

The sound output section 370 is formed of a speaker or the like, and outputs a variety of types of information as a sound or a voice based on the sound signal input from the processing circuit 320.

The electronic apparatus 300 according to the present embodiment is provided with the timer 1 which copes with the fast access from the processing circuit 320, and at the same time, is capable of reducing the possibility that the wrong timing data are generated, and can therefore realize high reliability.

As such an electronic apparatus 300, a variety of electronic apparatuses can be adopted, and there can be cited, for example, an electronic watch, a personal computer such as a mobile type personal computer, a laptop personal computer, and a tablet personal computer, a mobile terminal such as a smartphone or a cellular phone, a digital camera, an inkjet ejection device such as an inkjet printer, a storage area network apparatus such as a router or a switch, a local area network apparatus, an apparatus for a mobile terminal base station, a television set, a video camera, a video cassette recorder, a car navigation system, a real-time clock device, a pager, a personal digital assistance, an electronic dictionary, an electronic calculator, an electronic game machine, a gaming controller, a word processor, a workstation, a picture phone, a security television monitor, electronic binoculars, a POS terminal, a medical instrument such as an electronic thermometer, a blood pressure monitor, a blood glucose monitor, an electrocardiograph, ultrasonic diagnostic equipment, and an electronic endoscope, a fish finder, a variety of measuring instruments, gauges for cars, aircrafts, boats, and ships, a flight simulator, a head-mounted display, a motion tracer, a motion tracker, a motion controller, and a pedestrian dead reckoning (PDR) system.

3. Vehicle

Figure 11:
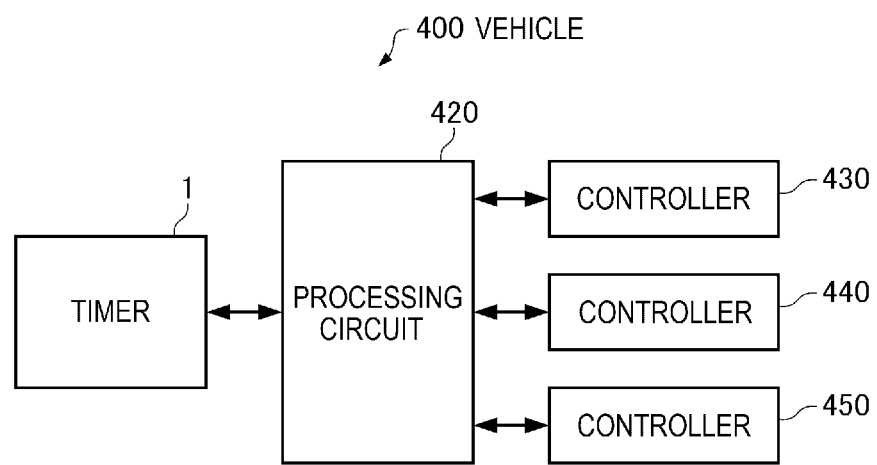
FIG. 11 is a functional block diagram of a vehicle according to an embodiment.
Figure 12:
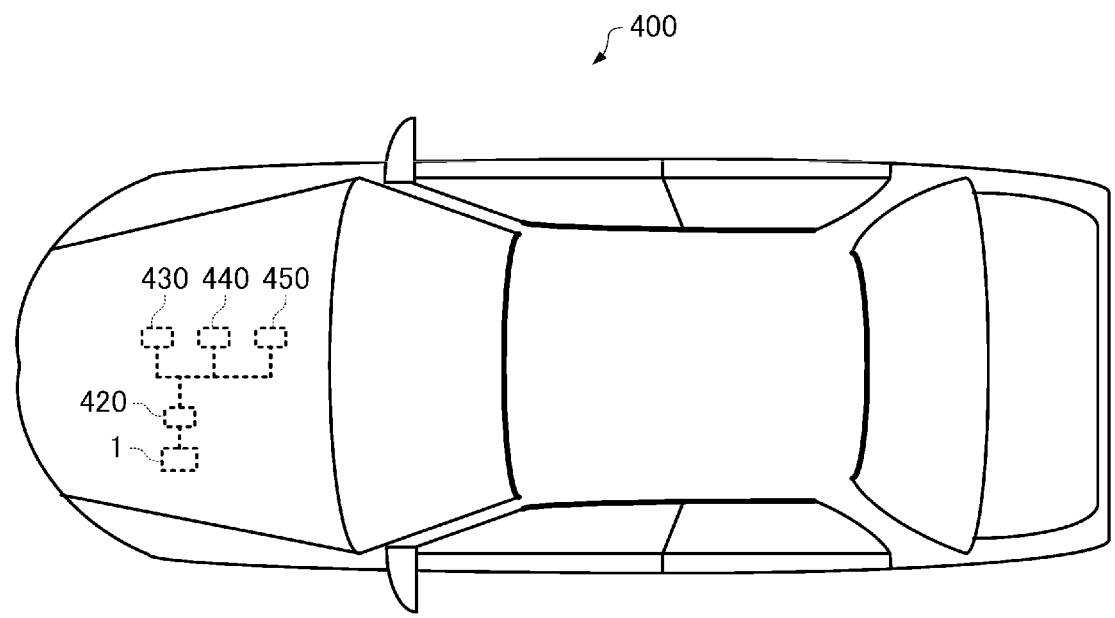
FIG. 12 is a diagram showing an example of the vehicle according to the embodiment.

FIG. 11 is a functional block diagram showing an example of a configuration of a vehicle according to another embodiment using the timer 1 according to the present embodiment described above. Further, FIG. 12 is a diagram showing an example of the vehicle according to the present embodiment. The vehicle 400 according to the present embodiment is configured including the timer 1, a processing circuit 420, and controllers 430, 440, and 450. It should be noted that the vehicle according to the present embodiment can be provided with a configuration obtained by omitting some of the constituents shown in FIG. 11 and FIG. 12, or adding other constituents thereto.

The processing circuit 420 performs a variety of calculation processes and control processes in accordance with programs stored in the storage section and so on not shown. Specifically, the processing circuit 420 performs a process of controlling the controllers 430, 440, and 450. Further, the processing circuit 420 operates based on an output signal from the timer 1. Specifically, the processing circuit 420 retrieves the timing data and so on from the timer 1 to perform the variety of calculation processes and control processes. Further, the processing circuit 420 performs rewriting of the timing data to the timer 1. The processing circuit 420 is realized by, for example, an MCU or an MPU. It should be noted that the processing circuit 420 corresponds to the master control device 6 described above.

The controllers 430, 440, and 450 perform a variety of types of control such as engine system control, brake system control, and a keyless entry system control to the vehicle 400.

The vehicle 400 according to the present embodiment is provided with the timer 1 which copes with the fast access from the processing circuit 420, and at the same time, is capable of reducing the possibility that the wrong timing data are generated, and can therefore realize high reliability.

As such a vehicle 400, there can be adopted a variety of types of vehicles, and there can be cited, for example, a car such as an electric car, an aircraft such as a jet plane and a helicopter, a ship, a boat, a rocket, and an artificial satellite.

The present disclosure is not limited to the present embodiment, but can be implemented with a variety of modifications within the scope or the spirit of the present disclosure.

The embodiments and the modified examples described above are illustrative only, and the present disclosure is not limited to the embodiments and the modified examples. For example, it is also possible to arbitrarily combine any of the embodiments and the modified examples described above with each other.

The present disclosure includes configurations (e.g., configurations having the same function, the same way, and the same result, or configurations having the same object and the same advantage) substantially the same as the configuration described as the embodiment. Further, the present disclosure includes configurations obtained by replacing a non-essential part of the configurations described as the embodiments. Further, the present disclosure includes configurations providing the same functions and advantages and configurations capable of achieving the same object as those of the configurations described as the embodiments. Further, the present disclosure includes configurations obtained by adding known technologies to the configurations described as the embodiments.

What is claimed is:

1. A timer comprising:
a timing counter configured to generate a timing datum;
a clock pulse signal generation circuit configured to generate a clock pulse signal used to operate the timing counter; and
an interface circuit configured to receive an access signal, wherein
the timing counter is an asynchronous counter,
the clock pulse signal generation circuit
generates the clock pulse signal having a first pulse width when there is a possibility that the interface circuit receives the access signal, and
generates the clock pulse signal having a second pulse width longer than the first pulse width when there is no possibility that the interface circuit receives the access signal, and
the second pulse width is a length obtained by multiplying a period of a source clock signal by 2 to N-th power, N representing a natural number.

2. The timer according to claim 1, wherein
the first pulse width is shorter than a cycle time of the access signal.

3. The timer according to claim 1, wherein
the clock pulse signal generation circuit determines whether or not there is a possibility that the interface circuit receives the access signal based on a first power supply voltage supplied to the timer.

4. The timer according to claim 3, further comprising:
a power supply voltage determination circuit configured to determine whether or not the first power supply voltage is no lower than a predetermined voltage value, wherein
the clock pulse signal generation circuit
   determines that there is a possibility that the interface circuit receives the access signal when the power supply voltage determination circuit determines that the first power supply voltage is no lower than the predetermined voltage value, and
   determines that there is no possibility that the interface circuit receives the access signal when the power supply voltage determination circuit determines that the first power supply voltage is lower than the predetermined voltage value.

5. The timer according to claim 4, further comprising:
a power supply voltage selection circuit configured to select the first power supply voltage when the power supply voltage determination circuit determines that the first power supply voltage is no lower than the predetermined voltage value, and select a second power supply voltage supplied to the timer when the power supply voltage determination circuit determines that the first power supply voltage is lower than the predetermined voltage value.

6. The timer according to claim 1, wherein
the clock pulse signal generation circuit includes
   a pulse signal generation circuit configured to generate a pulse signal based on a signal obtained by dividing a frequency of a source clock signal,
   a delay circuit configured to output a signal obtained by delaying the pulse signal,
   a selector configured to select and output one of an output signal of the delay circuit and a signal having a constant voltage, and
   a logic circuit to which an output signal of the selector and the pulse signal are input,
the clock pulse signal having the first pulse width is a signal output from the logic circuit when the selector selects and outputs the output signal of the delay circuit, and
the clock pulse signal having the second pulse width is a signal output from the logic circuit when the selector selects and outputs the signal having the constant voltage.

7. An electronic apparatus comprising:
the timer according to claim 1; and
a processing circuit which operates based on an output signal from the timer.

8. A vehicle comprising:
the timer according to claim 1; and
a processing circuit which operates based on an output signal from the timer.

9. A timer comprising:
a timing counter configured to generate a liming datum:
a clock pulse signal generation circuit configured to generate a clock pulse signal used to operate the timing counter:
an interface circuit configured to receive an access signal, and
a read buffer configured to obtain and hold, at predetermined timing, the timing datum generated by the timing counter, wherein
the timing counter is an asynchronous counter, and
the clock pulse signal generation circuit
   generates the clock pulse signal having a first pulse width when there is a possibility that the interface circuit receives the access signal, and
   generates the clock pulse signal having a second pulse width longer than the first pulse width when there is no possibility that the interface circuit receives the access signal,
the interface circuit outputs the timing datum held by the read buffer when receiving the access signal requesting reading of the timing datum, and
the timing counter generates the timing datum with a predetermined period irrespective of whether or not the interface circuit received the access signal.

10. A timer comprising:
a timing counter configured to generate a timing datum; signal used to operate the timing counter, and
an interface circuit configured to receive an access signal wherein
the timing counter is an asynchronous counter,
the clock pulse signal generation circuit
   generates the clock pulse signal having a first pulse width when there is a possibility that the interface circuit receives the access signal, and
   generates the clock pulse signal having a second pulse width longer than the first pulse width when there is no possibility that the interface circuit receives the access signal, and
the timing datum includes time information of a year, a month, a day, an hour, a minute, and a second.

* * * * *